(12) United States Patent
Polimeni et al.

(10) Patent No.: US 9,778,336 B2
(45) Date of Patent: Oct. 3, 2017

(54) SYSTEM AND METHOD FOR RAPID, MULTI-SHOT SEGMENTED MAGNETIC RESONANCE IMAGING

(71) Applicants: Jonathan R Polimeni, Cambridge, MA (US); Lawrence L Wald, Cambridge, MA (US); Kawin Setsompop, Cambridge, MA (US)

(72) Inventors: Jonathan R Polimeni, Cambridge, MA (US); Lawrence L Wald, Cambridge, MA (US); Kawin Setsompop, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 733 days.

(21) Appl. No.: 14/180,026

(22) Filed: Feb. 13, 2014

(65) Prior Publication Data

US 2014/0225612 A1   Aug. 14, 2014

Related U.S. Application Data

(60) Provisional application No. 61/764,081, filed on Feb. 13, 2013.

(51) Int. Cl.
  *G01R 33/48*   (2006.01)
  *G01R 33/483*  (2006.01)
  *G01R 33/561*  (2006.01)

(52) U.S. Cl.
  CPC ...... *G01R 33/4835* (2013.01); *G01R 33/5611* (2013.01); *G01R 33/5616* (2013.01)

(58) Field of Classification Search
  CPC ............ G01R 33/4835; G01R 33/5611; G01R 33/5616; G01R 33/4806; G01R 33/543;
  (Continued)

(56) References Cited

U.S. PATENT DOCUMENTS 6,841,998 B1   1/2005  Griswold
8,981,776 B2 *  3/2015  Setsompop ............ G01R 33/54
                                                         324/309

(Continued)

OTHER PUBLICATIONS

Yutzy et al, Improvements in Multislice Parallel Imaging Using Radial CAIPIRNHA, Magn. Reson. Med. 2011.*

(Continued)

*Primary Examiner* — Clayton E Laballe
*Assistant Examiner* — Ruifeng Pu
(74) *Attorney, Agent, or Firm* — Quarles & Brady LLP

(57) ABSTRACT

A system and method for medical imaging using a magnetic resonance imaging system includes performing a segmented echo planar imaging (EPI) pulse sequence. The pulse sequence includes performing multiple radio frequency (RF) excitation pulses designed to excite multiple imaging slices across the subject simultaneously. A gradient encoding scheme applied along the slice-encoding direction is implemented to impart controlled phase shifts to the different imaging slices. Additionally, the multiple RF excitation pulses can be designed to further control an overlap of imaging data acquired from adjacent slices of the multiple imaging slices based on a selected offset. The acquired imaging data is reconstructed using a parallel imaging reconstruction method that separates overlapped slices in the imaging data to provide a series of images with respective images for each of the multiple imaging slices across the subject.

19 Claims, 9 Drawing Sheets

(58) Field of Classification Search
CPC ............ G01R 33/4826; G01R 33/54; G01R 33/5601; G01R 33/5635; G01R 33/56366; G01R 33/56554; G01R 33/5656; A61B 5/055
See application file for complete search history.

(56) References Cited

U.S. PATENT DOCUMENTS

| | | | | |
|---|---|---|---|---|
| 2011/0254548 A1* | 10/2011 | Setsompop | ........ | G01R 33/4835 324/309 |
| 2011/0254549 A1* | 10/2011 | Lin | ............ | G01R 33/5611 324/309 |
| 2012/0013336 A1* | 1/2012 | Hetzer | ............ | G01R 33/4818 324/309 |
| 2012/0313640 A1* | 12/2012 | Pfeuffer | ............ | A61B 5/055 324/309 |
| 2012/0319686 A1* | 12/2012 | Jesmanowicz | ......... | A61B 5/055 324/309 |
| 2013/0099784 A1* | 4/2013 | Setsompop | ............ | G01R 33/54 324/309 |
| 2013/0190601 A1* | 7/2013 | Alsop | ............ | G01R 33/5601 600/410 |
| 2014/0225612 A1* | 8/2014 | Polimeni | ............ | G01R 33/48 324/309 |
| 2014/0253120 A1* | 9/2014 | Ugurbil | ............ | A61B 5/055 324/309 |
| 2015/0065865 A1* | 3/2015 | Leigh | ............ | A61B 5/055 600/420 |
| 2016/0209487 A1* | 7/2016 | Stern | ............ | G01R 33/4806 |

OTHER PUBLICATIONS

Breuer, et al., Controlled Aliasing in Parallel Imaging Results in Higher Acceleration (CAIPIRINHA) for Multi-Slice Imaging, Magnetic Resonance in Medicine, 2005, 53:684-691.
Conolly, et al., Variable-Rate Selective Excitation, Journal of Magnetic Resonance, 1988, 78(3):440-458.
Feinberg, et al., Simultaneous Echo Refocusing in EPI, Magnetic Resonance in Medicine, 2002, 48(1):1-5.
Feinberg, et al., Multiplexed Echo Planar Imaging for Sub-Second Whole Brain FMRI and Fast Diffusion Imaging, PLoS ONE, 2010, 5(12):e15710, pp. 1-11.
Larkman, et al., Use of Multicoil Arrays for Separation of Signal from Multiple Slices Simultaneously Excited, Journal of Magnetic Resonance Imaging, 2001, 13:313-317.
Pfeuffer, et al., Correction of Physiologically Induced Global Off-Resonance Effects in Dynamic Echo-Planar and Spiral Functional Imaging, Magnetic Resonance in Medicine, 2002, 47:344-353.
Setsompop, et al., Blipped CAIPIRHINA for Simultaneous Multi-Slice EPI with Reduced g-factor Penalty, Proc. Intl. Soc. Mag. Reson. Med., 2010, 18:551.
Setsompop, et al., Blipped-Controlled Aliasing in Parallel Imaging (blipped-CAIPI) for Simultaneous Multi-Slice EPI with Reduced g-factor Penalty, Magnetic Resonance in Medicine, 2012, 67(5):1210-1224.
Souza, et al., SIMA: Simultaneous Multislice Acquisition of MR Images by Hadamard-Encoded Excitation, Journal of Computer Assisted Tomography, 1988, 12(6):1026-1030.

* cited by examiner

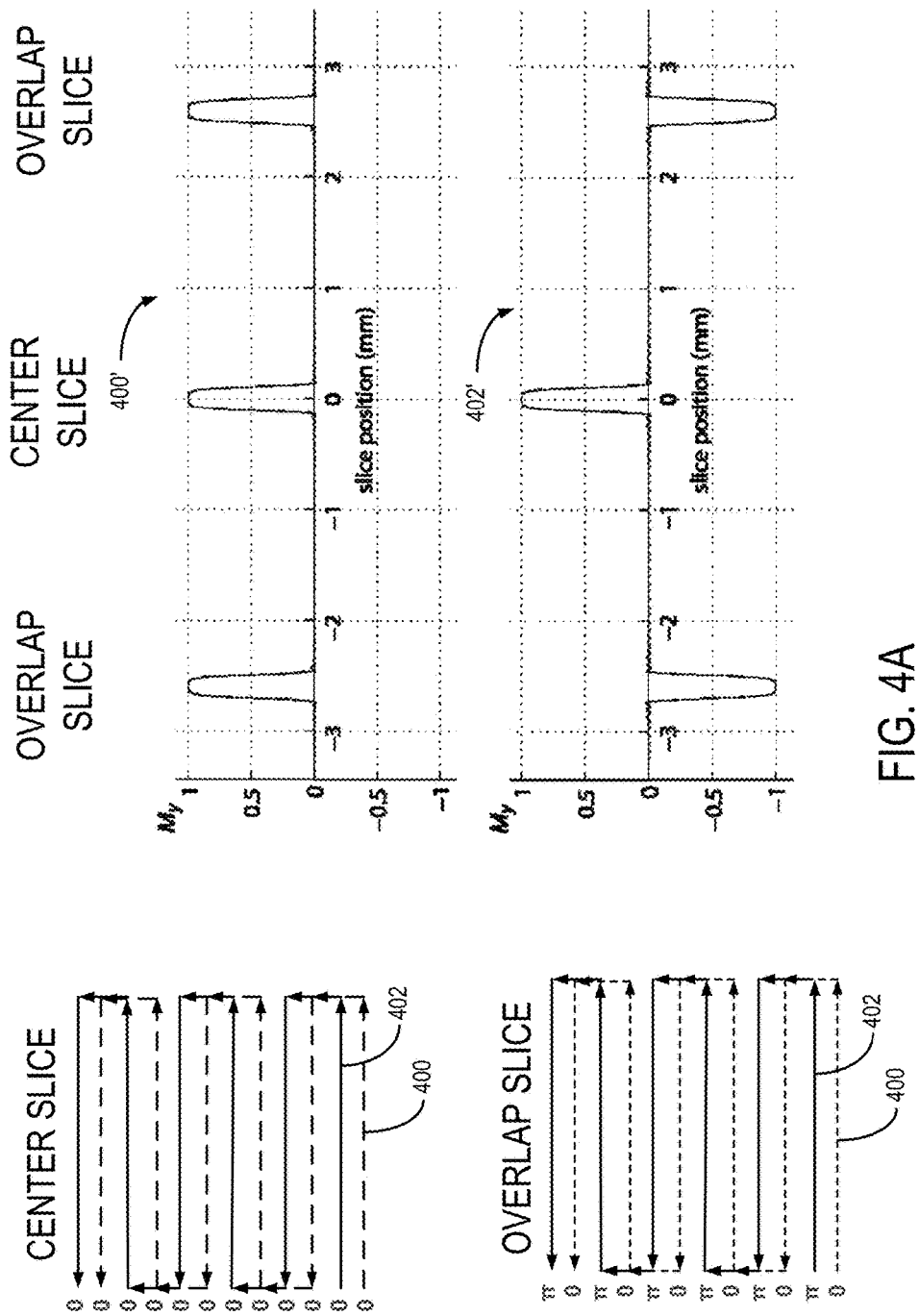

SYSTEM AND METHOD FOR RAPID, MULTI-SHOT SEGMENTED MAGNETIC RESONANCE IMAGING

CROSS-REFERENCE TO RELATED APPLICATIONS

This application claims the benefit of U.S. Provisional Patent Application Ser. No. 61/764,081, filed on Feb. 13, 2013, and entitled "System and Method for Rapid, Multi-Shot Segmented Magnetic Resonance Imaging."

STATEMENT REGARDING FEDERALLY SPONSORED RESEARCH

N/A.

BACKGROUND OF THE INVENTION

The field of the invention is systems and methods for magnetic resonance imaging ("MRI"). More particularly, the invention relates to MRI systems and methods for simultaneously acquiring images from multiple different slice locations.

When a substance such as human tissue is subjected to a uniform magnetic field (polarizing field B0), the individual magnetic moments of the excited nuclei in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, Mz, may be rotated, or "tipped", into the x-y plane to produce a net transverse magnetic moment Mt. A signal is emitted by the excited nuclei or "spins", after the excitation signal B1 is terminated, and this signal may be received and processed to form an image.

When utilizing these "MR" signals to produce images, magnetic field gradients (Gx, Gy, and Gz) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then performing a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Depending on the technique used, many MR scans currently require many minutes to acquire the necessary data used to produce medical images. The reduction of this scan time is an important consideration, since reduced scan time increases patient throughput, improves patient comfort, and improves image quality by reducing motion artifacts. Many different strategies have been developed to shorten the scan time.

One such strategy is referred to generally as "parallel MRI" ("pMRI"). Parallel MRI techniques use spatial information from arrays of radio frequency ("RF") receiver coils to substitute for the spatial encoding that would otherwise have to be obtained in a sequential fashion using RF pulses and magnetic field gradients, such as phase and frequency encoding gradients. Each of the spatially independent receiver coils of the array carries certain spatial information and has a different spatial sensitivity profile. This information is utilized in order to achieve a complete spatial encoding of the received MR signals, for example, by combining the simultaneously acquired data received from each of the separate coils. Parallel MRI techniques allow an undersampling of k-space by reducing the number of acquired phase-encoded k-space sampling lines, while keeping the maximal extent covered in k-space fixed. The combination of the separate MR signals produced by the separate receiver coils enables a reduction of the acquisition time required for an image, in comparison to a conventional k-space data acquisition, by a factor related to the number of the receiver coils. Thus the use of multiple receiver coils acts to multiply imaging speed, without increasing gradient switching rates or RF power.

Two categories of such parallel imaging techniques that have been developed and applied to in vivo imaging are so-called "image space methods" and "k-space methods." An exemplary image space method is known in the art as sensitivity encoding ("SENSE"), while an exemplary k-space method is known in the art as simultaneous acquisition of spatial harmonics ("SMASH"). With SENSE, the undersampled k-space data is first Fourier transformed to produce an aliased image from each coil, and then the aliased image signals are unfolded by a linear transformation of the superimposed pixel values. With SMASH, the omitted k-space lines are synthesized or reconstructed prior to Fourier transformation, by constructing a weighted combination of neighboring k-space lines acquired by the different receiver coils. SMASH requires that the spatial sensitivity of the coils be determined, and one way to do so is by "autocalibration" that entails the use of variable density k-space sampling.

Advancements to the SMASH techniques include using autocalibration in a technique known as generalized autocalibrating partially parallel acquisitions ("GRAPPA"), as described, for example, in U.S. Pat. No. 6,841,998. With GRAPPA, k-space lines near the center of k-space are sampled at the Nyquist frequency, in comparison to the undersampling employed in the peripheral regions of k-space. These center k-space lines are referred to as the so-called autocalibration signal ("ACS") lines, which are used to determine the weighting factors that are utilized to synthesize, or reconstruct, the missing k-space lines. In particular, a linear combination of individual coil data is used to create the missing lines of k-space. The coefficients for the combination are determined by fitting the acquired data to the more highly sampled data near the center of k-space.

Thus, conventional parallel MRI techniques rely on accelerating standard image acquisitions by undersampling k-space. These methods undersample k-space by reducing the number of phase-encodings acquired during each repetition of a pulse sequence. The acceleration is typically described in terms of the acceleration factor ("r-factor"). Related to the r-factor is the geometry factor ("g-factor"). For clarity, it is noted that the "r-factor", or simply R, is the amount of acceleration achieved using a parallel imaging technique. Thus, if the acquisition is sped up by a factor of three, the acquisition achieved an R of 3. The g-factor, however, is a measure of the resulting image quality in terms of the noise that becomes amplified during the application of the reconstruction algorithm (e.g., the SENSE algorithm or the GRAPPA algorithm). Because the value of g varies from pixel to pixel, a map of g-factors can be generated for the image to quantify the level of noise enhancement, and the values of g range from 1.00 to infinity, but are not integer values.

Unfortunately, scan time for volume coverage with echoplanar imaging ("EPI") or spiral-type MRI data acquisitions has not been substantially decreased by conventional parallel imaging techniques. This lack in scan-time reduction is because, if multiple slices are employed to cover the volume, the time of volume coverage is equal to the product of the number of slices needed to cover the volume and the acquisition period of each slice. The image acquisition period for each slice remains significant even when spatial encoding times are shortened by techniques like parallel imaging. This lack of scan time reduction is especially true when a physiological contrast preparation period (e.g. for imaging neuronal activity or water diffusion) precedes the spatial encoding period for each slice; the former can equal or exceed the latter in rapid imaging sequences such as EPI because it must be repeated for each slice. The problem is the same for fast acquisition techniques such as turbo-spin echo ("TSE") or fast spin echo ("FSE"); namely, multiple refocused echoes are formed using 180-degree pulses, as opposed to gradient reversal in EPI, to cover multiple k-space lines.

For example, high spatial resolution functional magnetic resonance imaging ("fMRI") acquisition methods commonly utilize the EPI pulse sequence. The EPI acquisition for each slice can take, for example, about 80 to 100 milliseconds ("ms"). Whole-head coverage at high resolution can require as many as 128 slices for 1 mm isotropic image voxels. Thus, the temporal resolution for the time series is 128 times 80 to 100 ms, which is around 10 seconds. This temporal resolution is often too slow for many functional paradigms, especially event-related paradigms. Thus, at best, an EPI sequence is typically only sped up by around 20 percent when using parallel imaging techniques, whereas conventional imaging sequences are sped up by around 200-300 percent.

Recently, other methods for decreasing scan time have been developed. For example, methods for the simultaneous acquisition of image data from multiple imaging slice locations, using an array of multiple RF receiver coils, and subsequent separation of the superimposed slices during image reconstruction have be introduced, as described by D. J. Larkman, et al., in "Use of Multicoil Arrays for Separation of Signal from Multiple Slices Simultaneously Excited," *Journal of Magnetic Resonance Imaging*, 2001; 13(2):313-317.

The Larkman method has been improved upon for conventional image acquisition techniques, as described, for example by F. A. Breuer, et al., in "Controlled Aliasing in Parallel Imaging Results in Higher Acceleration (CAIPIRINHA) for Multi-Slice Imaging," *Magn. Reson. Med.*, 2005; 53(3):684-691. This method, referred to as "CAIPIRINHA," increases the distance between aliased pixels by introducing a one-half FOV shift in the images of every other slice. This shift is achieved by modulating the phase of the RF excitation pulse used to acquire every other line of k-space by 180 degrees. In this manner, when the image slices superimpose, every-other slice is shifted by one-half of the FOV. Thus, aliased pixels are separated by one-half the FOV in the phase-encoding direction, and are separated, for example, by the 3 cm distance between the slices in slice-encoding direction. This added separation in the phase-encoding direction improves the ability of parallel image reconstruction methods, such as SENSE, to unalias the slices without producing artifacts or significant noise amplification. In addition, the one-half FOV shift also has the benefit that the method does not completely rely on the distribution in coil sensitivity modulation in the slice-encoding direction.

The CAIPIRINHA method still has challenges in various situations. For example, the one-half FOV shift imparted to every other slice is achieved by modulating the phase of the RF excitation pulses of every other line in k-space. While this is applicable to conventional acquisitions, in which every line of k-space is acquired with a separate excitation, it is not applicable to EPI acquisitions, in which all the lines of k-space are acquired after a single RF excitation. Thus, the CAIPIRINHA method is generally not extendable to EPI acquisitions.

Additionally, methods for simultaneous multi-slice imaging have been described, for example, by D. A. Feinberg, et al., in "Simultaneous Echo Refocusing in EPI," *Magn. Reson. Med.*, 2002; 48(1):1-5. In such methods, which may be referred to as "SER-EPI," the RF excitation of the slices is sequential, as opposed to truly simultaneous. A readout gradient pulse is applied between two sequential excitations, and acts to shift the k-space data of one slice relative to the other along the $k_x$-direction, which corresponds to the readout direction in image space. By lengthening the readout window, the k-space data for both slices is captured sequentially. The data can then be cut apart and reconstructed separately.

CAIPIRHINA and other simultaneous multi-slice methods have not yet gained great traction in conventional imaging, since there are alternative parallel imaging methods, such as conventional SENSE and GRAPPA, for accelerating standard image acquisitions. However, as noted above, these methods do not confer the same acceleration benefits on pulse sequences such as EPI as they do on other conventional pulse sequences. Unlike parallel imaging methods such as SENSE and GRAPPA, multi-slice acquisition techniques do not aim to shorten the time spent on reading out k-space data, for example, by reducing the number of phase-encodings. Rather, they aim to acquire signal data from multiple image slice locations per acquisition, such that the number of repetitions of a pulse sequence can be reduced to similarly reduce overall scan time. For example, a three-fold accelerated multi-slice acquisition acquires image data from three image slice locations per each repetition of the EPI sequence. As a result of this simultaneous acquisition, the number of repetitions of an EPI sequence required to cover an imaging volume is reduced, thereby similarly reducing the total acquisition time.

While such techniques allow for single-shot EPI acquisitions that mitigate the distortion and blurring effects seen at high magnetic field strengths, there is an intrinsic signal-to-noise ratio ("SNR") penalty that scales with the square-root of the r-factor and with g-factor, ultimately limiting its usability. Multi-shot segmented EPI acquisitions can similarly mitigate these deleterious effects, yet the longer temporal sampling interval amplifies physiological noise and system instabilities.

Thus, there continues to be a desire for systems and methods for MR imaging that yield both the inherent flexibility and benefits of EPI, but with substantial acceleration together with high image SNR and low physiological noise levels and low system instability.

SUMMARY OF THE INVENTION

The present invention overcomes the aforementioned drawbacks by providing a system and method for performing a segmented echo planar imaging ("EPI") acquisition technique together with a simultaneous multi-slice acquisition.

It is an aspect of the invention to provide a method for producing a series of images of a subject associated with a plurality of different slice locations using a magnetic resonance imaging ("MRI") system. The method includes directing the MRI system to perform a pulse sequence that includes generating an RF excitation field that simultaneously excites spins in a plurality of different slice locations. The pulse sequence also includes establishing a first magnetic field gradient sequence along a first direction to form magnetic resonance signals from the excited spins, and establishing a second magnetic field gradient sequence during the first magnetic field gradient sequence and along a second direction orthogonal to the first direction. The first and second magnetic field gradient sequences define a k-space trajectory that traverses a segment of k-space. The pulse sequence also includes establishing a third magnetic field gradient sequence during the first magnetic field gradient sequence and along a third direction orthogonal to the first and second directions. The third magnetic field gradient sequence imparts a phase shift to the formed magnetic resonance signals along one of the first and second directions. First k-space data is acquired from the segment of k-space, the first k-space data being indicative of the plurality of different slice locations. The pulse sequence and data acquisition is then repeated to acquire second k-space data from a different segment of k-space. During the repetition of the pulse sequence, at least one of the first and second magnetic field gradient sequences is modified to define a different k-space trajectory that traverses a different segment of k-space. From the first and second k-space data, a series of images is reconstructed. The series of images includes images associated with the plurality of different slice locations.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 4A is a graphic representation of a k-space sampling strategy and corresponding RF pulse waveforms with the appropriate phase shifts that may be used together with slice-encoding gradient blips to achieve the offset of FIG. 3.

DETAILED DESCRIPTION OF THE INVENTION

Described here are systems and methods for implementing simultaneous multislice ("SMS") imaging in a multi-shot, segmented echo planar imaging ("EPI") magnetic resonance imaging ("MRI"), or similar, pulse sequence.

Figure 1:
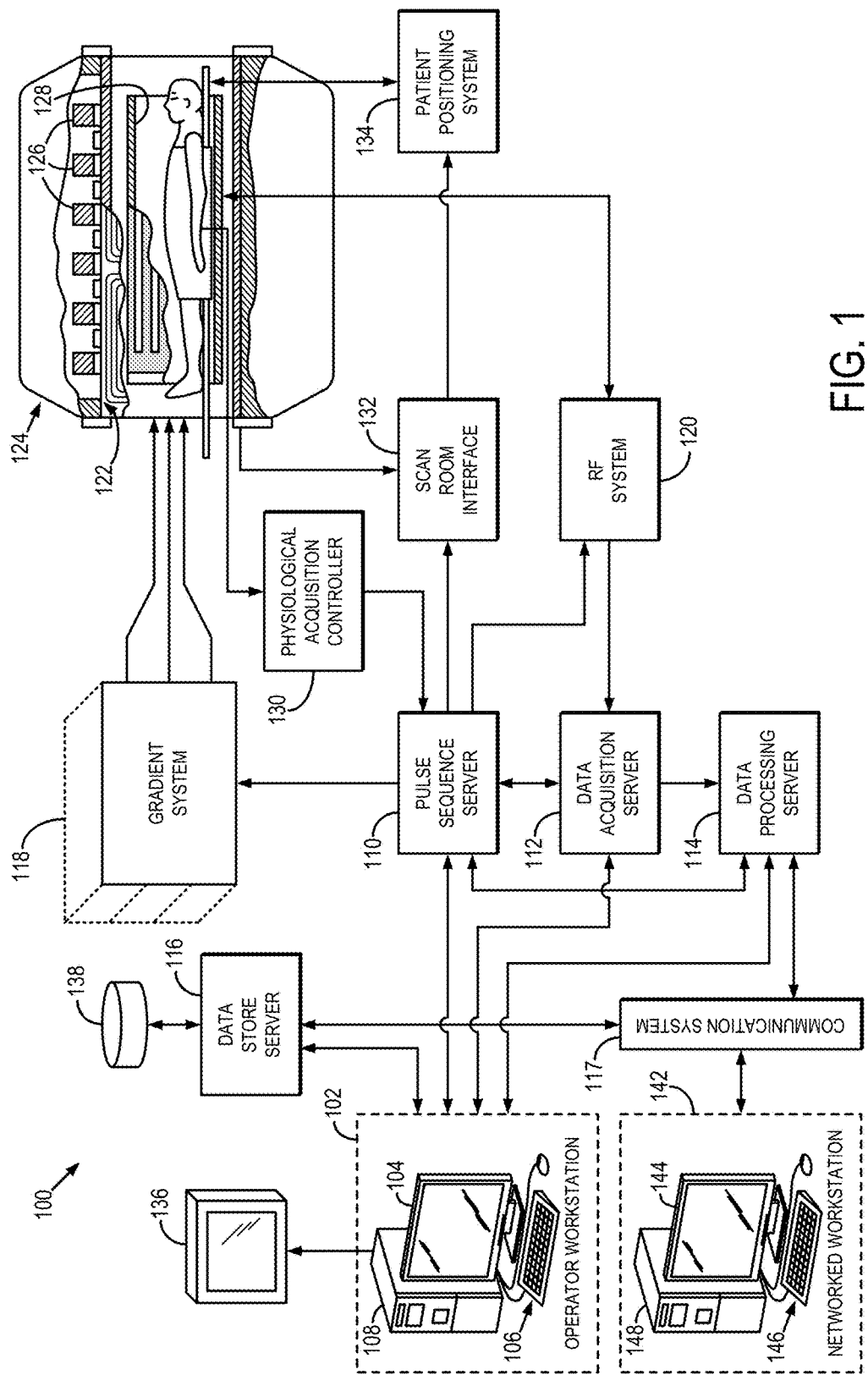
FIG. 1 is a block diagram of an example magnetic resonance imaging system configured for use with the present disclosure.

Referring particularly now to FIG. 1, an example of a magnetic resonance imaging ("MRI") system 100 is illustrated. The MRI system 100 includes an operator workstation 102, which will typically include a display 104; one or more input devices 106, such as a keyboard and mouse; and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil (not shown in FIG. 1), are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays (not shown in FIG. 1).

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography ("MRA") scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images;

generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol ("TCP"), the internet protocol ("IP"), or other known or suitable protocols.

As will be described, the present disclosure describes the use of a segmented EPI acquisition technique together with an SMS acquisition to simultaneously acquire imaging data from multiple slice locations and reconstruct medical images corresponding to those multiple different slice locations from that imaging data using an MRI system, such as described above with respect to FIG. 1.

Figure 2:
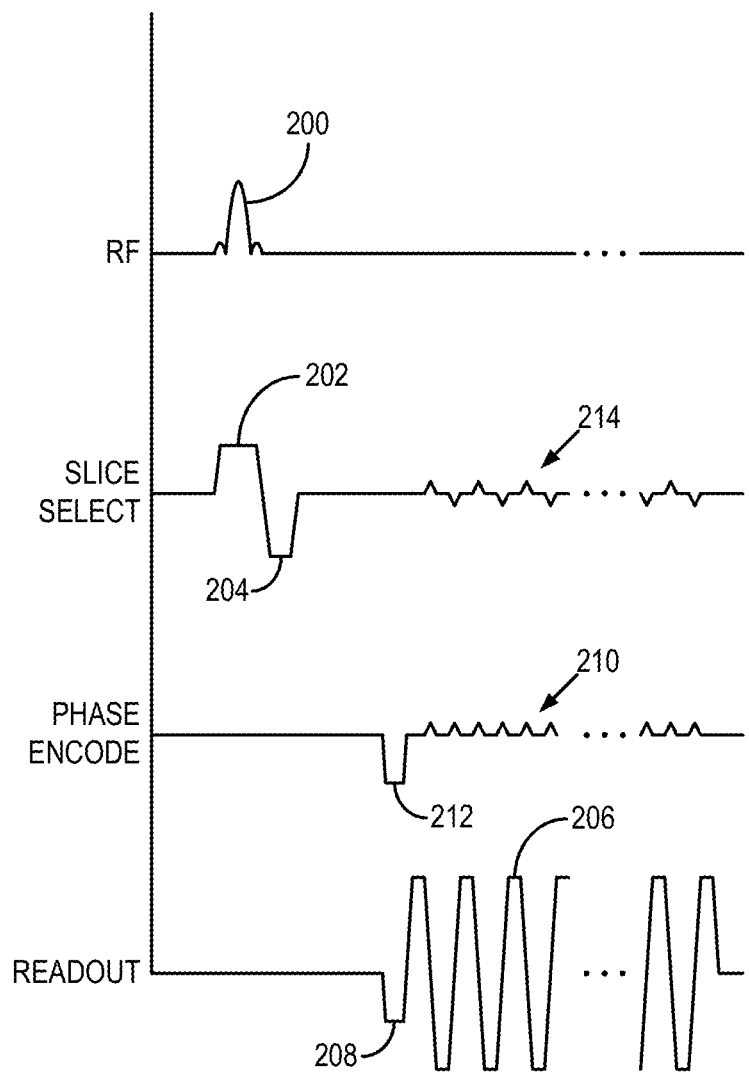
FIG. 2 is a graphic illustration of an exemplary gradient-recalled echo planar imaging ("EPI") pulse sequence for directing the MRI system of FIG. 1 to simultaneously acquire image data from multiple slice locations in a subject, such that a one-half field-of-view ("FOV") shift is imparted to MR signals acquired from slice locations adjacent a desired slice location.

Referring now to FIG. 2, an example of an EPI pulse sequence that implements some embodiments of the present invention is illustrated. In this example, the pulse sequence is a gradient-recalled EPI pulse sequence that is modified to acquire image data from multiple slice locations simultaneously. It will be appreciated by those skilled in the art that spin echo and other acquisition schemes can similarly be implemented. The pulse sequence includes a spatially selective RF excitation pulse 200 that is played out in the presence of a slice-selective gradient 202 in order to produce transverse magnetization in a plurality of prescribed imaging slices. The RF excitation pulse 200 is the summation of RF excitation pulses that would be used to separately excite the desired plurality of slice locations and is applied with a flip angle. The slice-selective gradient 202 includes a rephasing lobe 204 that acts to rephase unwanted phase dispersions introduced by the slice-selective gradient 202 such that signal losses resultant from these phase dispersions are mitigated.

Following excitation of the nuclear spins in the prescribed imaging slices, image data is acquired by sampling a series of gradient-recalled echo signals in the presence of an alternating readout gradient 206. The alternating readout gradient is preceded by the application of a pre-winding gradient 208 that acts to move the first sampling point along the frequency-encoding, or readout, direction by a distance $\Delta k_x$ in k-space. Spatial encoding of the echo signals along a phase-encoding direction is performed by a series of phase encoding gradient "blips" 210, which are each played out in between the successive signals readouts such that each echo signal is separately phase encoded. The phase encoding gradient blips 210 are preceded by the application of a pre-winding gradient 212 that acts to move the first sampling point along the phase-encoding direction a distance $\Delta k_y$ in k-space. Together, the pre-winding gradients 208 and 212 serve to begin the sampling of k-space at a defined k-space location $(k_x, k_y)$. In some other embodiments, the phase encoding gradient blips can be replaced with a constant magnetic field gradient, as is known in the art.

During the application of each phase encoding gradient blip 210, a magnetic field gradient blip is also played out along the slice-encoding direction. As illustrated, the slice encoding gradient blips 214 can be used to shift the image of every other slice by a desired amount, such as one-half, the imaging field-of-view ("FOV") along the phase encoding direction. Each successive slice-encoding gradient blip 214 is equal in magnitude and opposite in polarity than the preceding blip. In this manner, the slice-encoding gradient blips 214 do not produce phase accumulations in the phase-encoding direction in k-space because each successive blip 214 serves to unwind the phase accrued by the previous blip 214. However, each blip 214 does produce the desired phase shift between adjacent slice location encodings such that a desired FOV shift is provided in the image domain.

To achieve this one-half FOV shift in every other slice location, a relative phase increment of 180 degrees can be applied to successive $k_y$ lines by appropriate design of the slice-encoding blips 214. Using this slice-encoding gradient blip scheme, through-plane dephasing is substantially mitigated, thereby providing a significant decrease in pixel tilt and image blurring.

While gradient blips can be used to shift the FOV, the FOV shift can also be imposed or otherwise controlled by phasing the slice-selective RF pulses, instead of by only playing out a gradient blip 214 in the slice-encoding direction. By removing the need to control the phasing using only slice-encoding gradient blips, a faster overall acquisition can be achieved because additional phasing provided by RF pulse phasing can act to reduce the duration of the blips. The faster acquisition leads to reduced image distortion and blurring as well as a greater time efficiency. In these instances, the multi-shot EPI technique of the present invention can use a different RF pulse for each shot.

The exact amount of FOV shift can be selected by a user or by a system based on the number of slices simultaneously excited and the distance between those slices. For example, in some cases a ⅓ FOV shift may be used. In other cases, a ½ FOV shift may be desired. Of course, these are examples and other shifts are possible. The amount of shift may be pre-calculated based on the distance between the slices and may be chosen to optimize SNR. While a ½ FOV shift serve as an initial default shift, the ½ FOV shift will not be optimal for all situations. Thus, as will be described, the above-described system or particular methods of implementation may prompt for or otherwise select other shifts. Thus, reference to a ½ FOV shift or other value is an example that can be readily extended to many other FOV shifts.

To achieve some FOV shifts for a particular number of k-space segments, such as an FOV/3 shift with two k-space segments, a combination of both gradient-induced phasing and RF phasing may be necessary to realize the benefits of decreased scan time. It is also noted that using RF phasing alone, it may not be possible to achieve the desired FOV shift for a particular number of k-space segments. In these instances, the slice-encoding gradient blips described herein are required. Thus, the slice-encoding gradient blips provide flexibility to control the FOV shift and number of segments independently. As noted above, RF phasing can compliment the slice-encoding gradient blips by allowing a reduction in overall scan time.

As is known in the art, the foregoing pulse sequence can be repeated a plurality of times with a different slice-selective gradient 202 being applied in each repetition such that multiple sets of a plurality of slice locations are sampled.

To improve upon the foregoing image encoding techniques, a multiband RF excitation pulse that substantially simultaneously excites multiple slice locations can be incorporated into the data acquisition. In some embodiments, a different RF pulse may be used for each EPI segment, whereas other multi-slice techniques use only one pulse for each. With such an RF excitation, each image collected contains information from the multiple slice locations, rather than just a single slice location. The information pertaining to the multiple different slice locations can subsequently be separated to produce a single, unaliased image for each of the multiple slice locations. This unaliasing utilizes multiple receive channels and the spatial encoding information inherent in the use of such multiple receivers. This approach can be generally referred to as multiband excitation in the slice-encoding axis to achieve spatial multiplexing.

Simultaneous multi-slice (SMS) techniques have been used to increase temporal sampling rates in fMRI by factors of three and higher without the VR penalty. In fact, these techniques have been successful in providing temporal sampling rates above what is needed for sampling the blood oxygen level dependent ("BOLD") contrast mechanism, upon which fMRI is substantially dependent. Thus, as will be described, the present disclosure recognizes that it can be beneficial to use the SMS method (with its lack of a $\sqrt{R}$ penalty) in conjunction with multi-shot imaging (also lacking the $\sqrt{R}$ penalty) and rely less on in-plane acceleration for distortion mitigation in high-resolution fMRI. Thus, the present disclosure merges a segmented, multi-shot EPI acquisition with the SMS technique, retaining a conventional 2-3 s sampling interval. This combination allows each EPI segment to employ a distinct multi-slice excitation pulse similar to that used in the CAIPIRINHA technique, enabling advantageous slice-aliasing patterns to reduce the g-factor of the SMS image reconstruction. This eliminates the need for a blip scheme that achieves the same end. That is, the use of two segments enables a application of a FOV/2 shift of the collapsed slices, similar to the original CAIPIRINHA method, obviating the need for additional gradient blips in the z direction to impose this shift. However, to extend this framework to more segments and shots, z-gradient blips are preferably utilized in addition to phase shifting in multiband RF pulses to achieve the desired image shifts.

Figure 3:
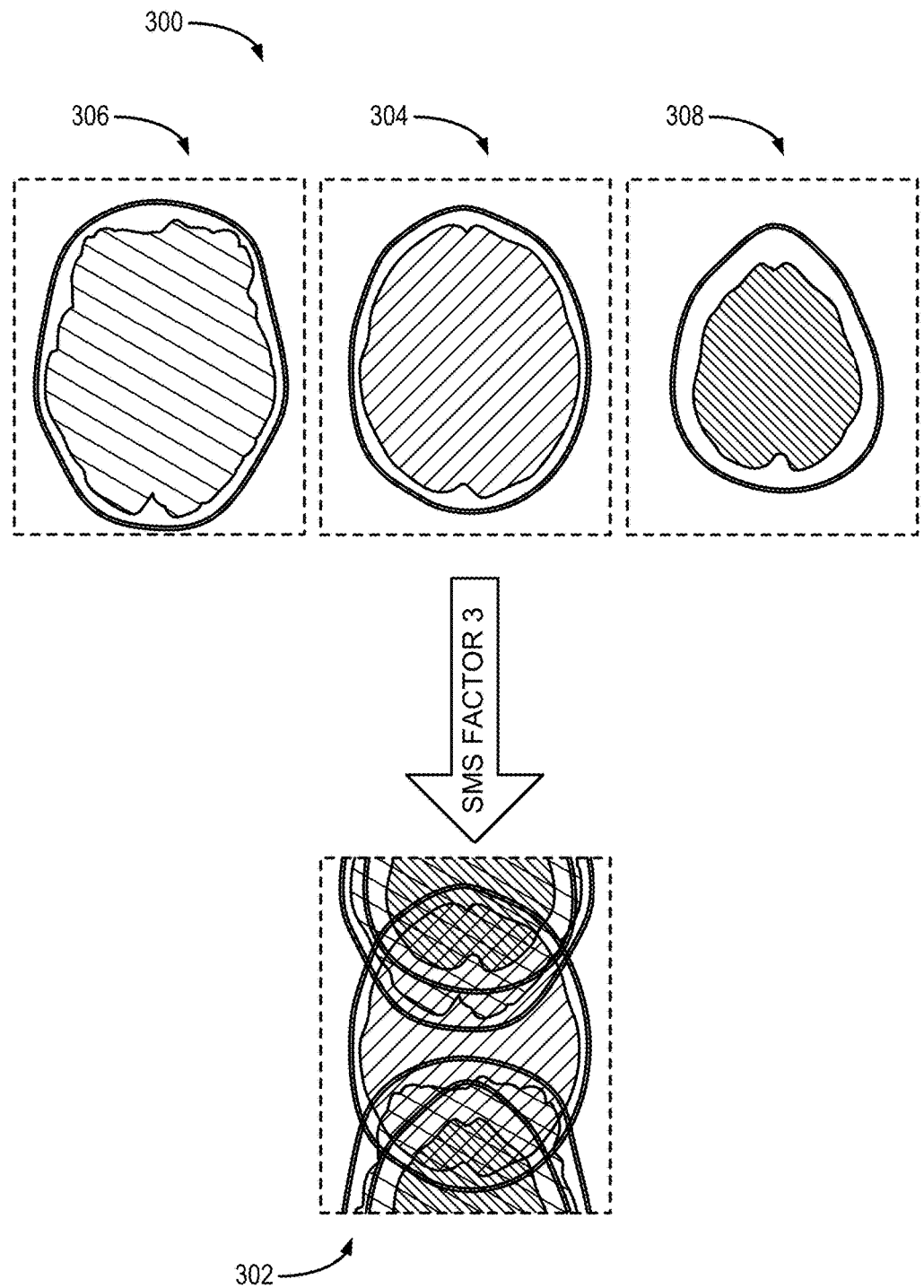
FIG. 3 is a graphic illustration of a simultaneous, multi-slice data acquisition using an offset in accordance with the present invention.
Figure 4B:
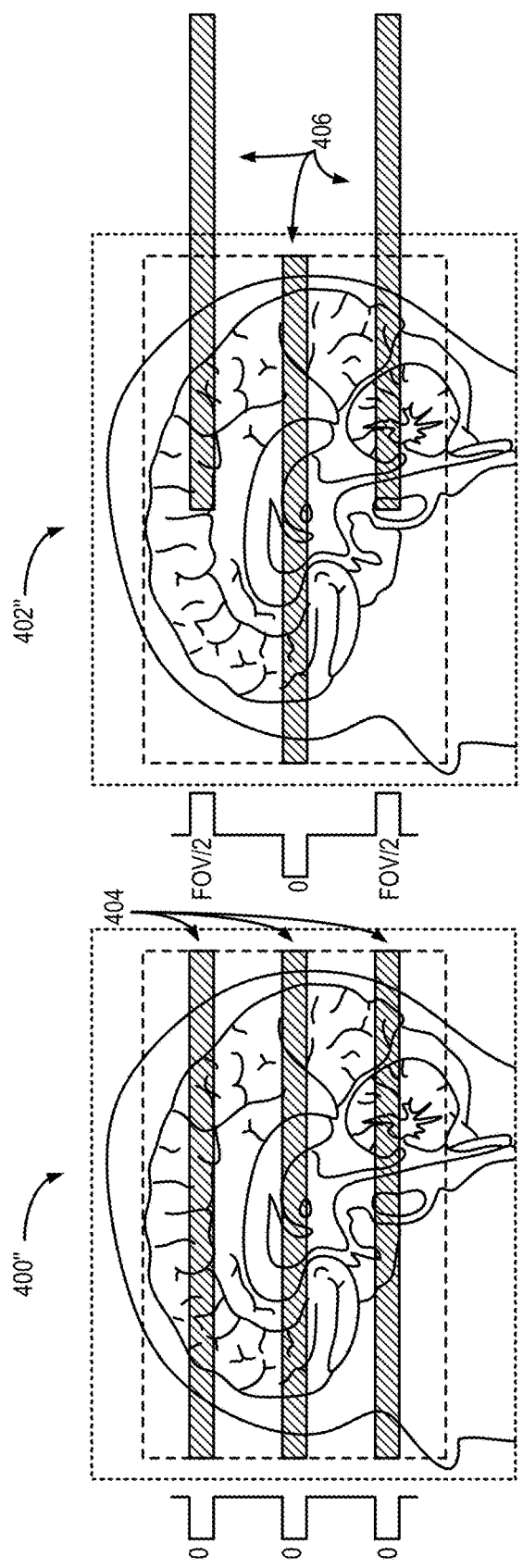
FIG. 4B is a graphic representation of a multi-slice orientation and offset with respect to an anatomical representation demonstrating the one-half FOV shift imparted by the combination of the two distinct RF pulses for the two shots of the segmented EPI acquisition.

Referring to FIG. 3, the foregoing EPI pulse sequences, such as the GE-EPI pulse sequence described with respect to FIG. 2, can further be modified to provide different FOV shifts in the image domain, such as an FOV/2 shift. To do so, for example, a group of three EPI slices 300 can be acquired simultaneously 302. That is, three EPI slices 300 representing a center slice 304, a first overlap slice 306, and a second overlap slice 308, are acquired simultaneously, representing a SMS factor of 3. Specifically, referring to FIG. 4A, a 2-shot segmented EPI k-space trajectory is illustrated to achieve a FOV/2 shift of overlap slices by adding a 180 degree phase between components of the SMS pulse for the first shot 400 and components of the SMS pulse for the second shot 402, which are depicted by RF pulse magnetization profiles 400' and 402', respectively. A distinct pulse can therefore be used for each of the two segments. The first pulse of the first segment can be a concatenation of three identical slice-selective pulses, whereas the pulse of the second segment imposes no additional phase on the center slice, and adds a phase shift, for example, a π phase shift, to the overlap slices, to enact a FOV/2 shift of the overlap slices. Referring to FIG. 4B, this point is illustrated with respect to the orientation of the slices 404 for the first shot 400" relative to the slices 406 for the second shot 402". To compensate for the increased SAR in SMS3 concatenated pulses, the pulses may be designed with the variable-rate selective excitation (VERSE) technique, by which a time-varying gradient waveform is combined with a modified RF waveform to provide the same excitation profile with different RF power and duration characteristics, such as described by Connolly et al. (1988) JMR 78:440, to reduce the maximum voltage, for example, by a selected factor. For example, the VERSE method can be utilized to reduce the maximum power by a desired amount, such as by a factor of 1.1 or by a factor of 3. Higher factors cause artifacts, while lower factors provide reduced benefits.

Figure 5:
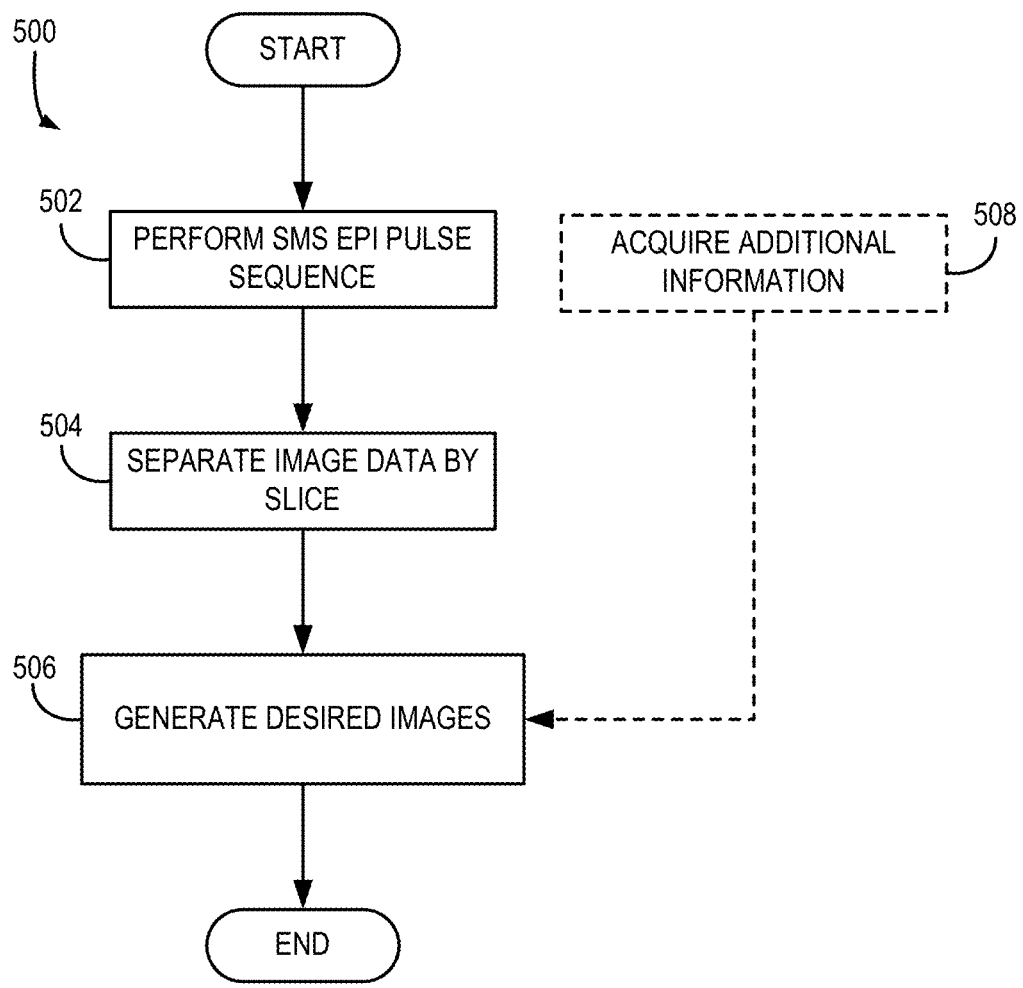
FIG. 5 is a flow chart setting for exemplary steps of a method in accordance with the present invention.

Thus, referring to FIG. 5, a process 500 in accordance with the present disclosure begins by performing a pulse sequence, such as described above. For example, at process block 502, a SMS or multi-segment EPI pulse sequence is performed. Specifically, for each EPI segment, a distinct RF pulse is designed to excite multiple image slices simultaneously. Each pulse sequence thus generally includes generating an RF excitation field that simultaneously excites spins in multiple different slice locations, as described above. As an example, this RF excitation field may be generated using a multiband RF pulse that is composed of multiple different sub-pulses. For instance, each sub-pulse may correspond to exciting spins in a particular slice location. In some embodiments, the multiband RF pulse is modified in some repetitions of the pulse sequence, such that a different phase pattern is applied to the slice locations when acquiring different segments of k-space.

The RF pulses may therefore designed such that the overlap between simultaneously acquired slices is controlled or, preferably, minimized. As described above with respect to FIGS. 4A and 4B, a distinct excitation RF pulse may be used for each segment, where the first pulse of the first segment can be a concatenation of three identical slice-selective pulses and the pulse of the second segment imposes no additional phase on the center slice but adds a phase shift, for example, a π phase shift, to the overlap slices, to enact a FOV/2 shift of the overlap slices.

Each pulse sequence also generally includes a first, second, and third magnetic field gradient sequence, each applied along different, mutually orthogonal directions, as described above. For instance, the first magnetic field gradient sequence can be an alternating magnetic field applied along a frequency-encoding direction and used to form magnetic resonance signals responsive to the RF excitation field. As an example, the second magnetic field gradient sequence can include a blipped phase-encoding gradient sequence or a constant phase encoding gradient, as they are used in some implementations of EPI sequences. Together, these magnetic field gradient sequences define the k-space trajectory that traverses a given segment of k-space. Thus, some repetitions of the pulse sequence may include modifying one or more of these gradients such that different k-space trajectories corresponding to different segments of k-space are traversed.

The third magnetic field gradient sequence may includes the sequence of magnetic field gradient blips applied along the slice-encoding direction, as described above. This blipped encoding scheme imparts a phase shift to the magnetic resonance signals to introduce the FOV shifts also described above. In some embodiments, this third magnetic field gradient sequence thus includes a sequence of magnetic field gradient blips having different magnitudes, polarities, or both, so as to impart the desired FOV shift to the collapsed image slices. In some embodiments, the third magnetic field gradient sequence can be modified in some repetitions of the pulse sequence, such that different phase shift patterns are applied to different segments of k-space.

At process block 504, the image data associated with each of the individual slice locations are then separated from the acquired, overlapped data using parallel imaging methods. For example, a slice-GRAPPA reconstruction method may be employed to separate overlapped slices in collapsed data. The favorable overlap between images using the above-described pulse sequence leads to an increased performance of the image separation, with fewer artifacts and less noise enhancement.

At process block 506, the reconstructed images can be assembled into a desired set of images, which, as indicated at process block 508, may include coupling with additional information, such a physiological data acquired contemporaneously with performing the SMS EPI pulse sequence of process block 502. That is, acquiring slices simultaneously decreases the interval of time between the acquisition of each segment in the multi-shot EPI acquisition compared to a conventional segmented EPI acquisition. This leads to reduced temporal variability in the data caused by misalignment between slices due to changes occurring in the subject between measurements, including changes in physiological state due to the respiratory and cardiac cycles or changes in head position. This technique therefore can improve the temporal stability of segmented, multi-shot EPI data and improve the process of coupling the acquired images with additional information, for example, such as trigger or stimulus information used as part of an fMRI study.

This process was further validated using studies. For example, in one such study, three subjects were studied with a 3T TimTrio MRI scanner (Siemens Healthcare, Erlangen, Germany) with the vendor 32-channel head coil array. The acquisitions were 1.5×1.5×2 mm3 gradient-echo EPI with a TR/TE/fa/matrix/BW/esp/Nrep=2.7 s/30 ms/90°/128×128/1S02 Hz/px/0.75 ms, with 60 timepoints and 39 slices. AN SMS rate 3 was employed such that each RF pulse excited 3 slices, reducing the TR to 0.9 s. Notably, due to the two shots, the "time per image" was 1.8 s. A distinct RF pulse was designed and used for each of the two segments. The first segment's pulse was a concatenation of three identical slice-selective pulses, whereas the second segment's pulse imposed a positive phase on the center slice and a negative phase on the two side slices. To compensate for the increased SAR in the concatenated pulses, the VERSE method was used to reduce the maximum voltage by a factor of two. To maximize image SNR, the flip angle was adjusted to 70° for each pulse. For comparison, distortion-matched R=2 accelerated EPI data was also acquired without SMS. All images were reconstructed offline, and the slice-GRAPPA method, such as described in Connolly et al. (1988) JMR 78:440 and Pfeuffer et al. (2002) MRM 47:344, both of which are incorporated herein by reference, was used to separate the collapsed slices in the SMS data.

Figure 6A:
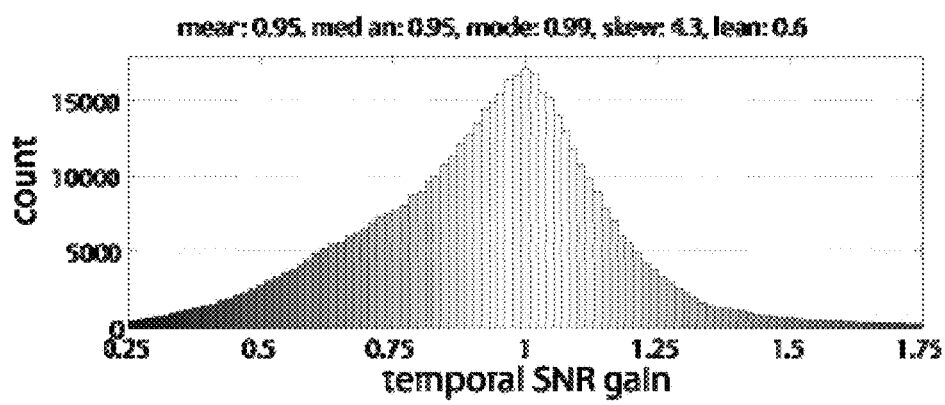
FIGS. 6A-6C are graphs illustrating temporal signal to noise (SNR) gains in accordance with exemplary implementations of the present invention.
Figure 6B:
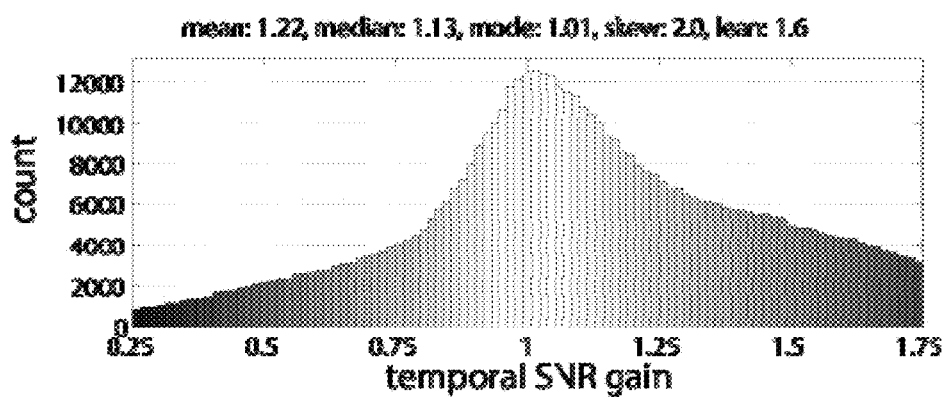
Figure 6C:
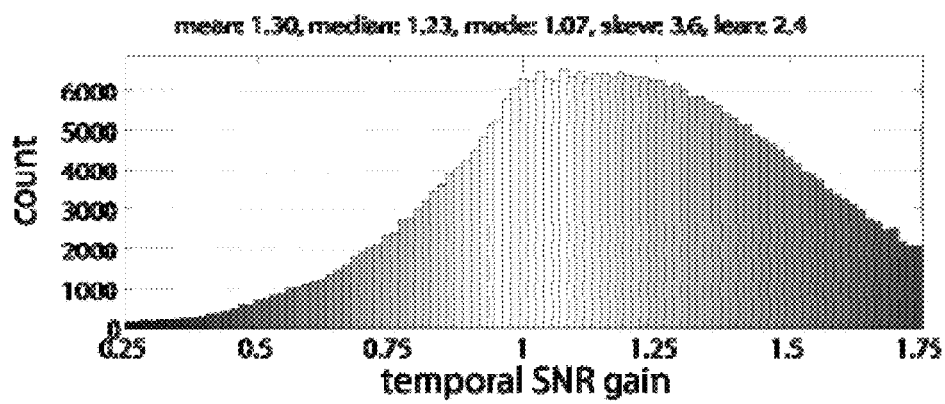

Referring to FIGS. 6A-6C, an SNR over time (SNRt) comparison of SMS2 data is provided. Specifically, FIG. 6A provides a ratio of the two-shot data reconstructed with the GRAPPA algorithm to conventional accelerated data reconstructed with the same GRAPPA algorithm. The small difference in signal levels may be attributed to the use of custom RF pulses in the two-shot acquisition. FIG. 6B shows a ratio of S=2 images to R=2 images. In the images, higher SNR was seen inside the brain, and the histogram of FIG. 6B shows a heavy tail indicating increased SNR in the multi-shot data. FIG. 6C shows that the SNR of the SMS2 S=2 data is substantially higher than that of the single-shot accelerated data.

Figure 7:
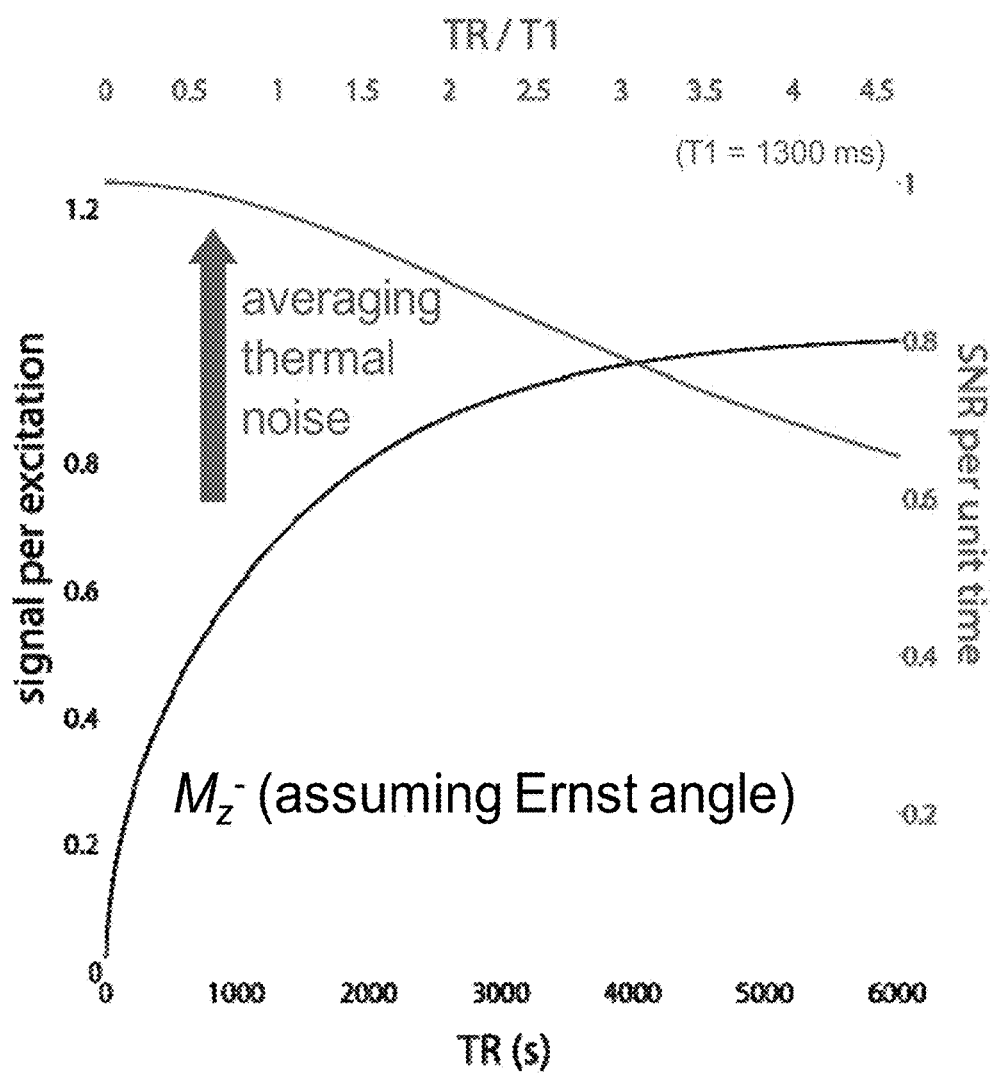
FIG. 7 is a graph illustrating the effects of repetition time (TR) on SNR within the context of the present invention.

FIG. 7 provides a graph illustrating the effects of repetition time (TR) on SNR. Assuming all acquisitions employ the Ernst angle, the signal per excitation is shown as a function of TR for an assumed T1 of 1300 ms. Shorter TRs allow more averaging, which cancels thermal noise; thus, the SNR per unit time is also a function of TR. For small TR values, averaging compensates for the signal losses due to T1 effects resulting in an increase the SNR efficiency relative to longer TRs. The signal loss for a TR of 2000 ms relative to a TR of 4000 ms is 16%, but after averaging there is a relative signal gain of 19% with the shorter TR value.

Figure 8:
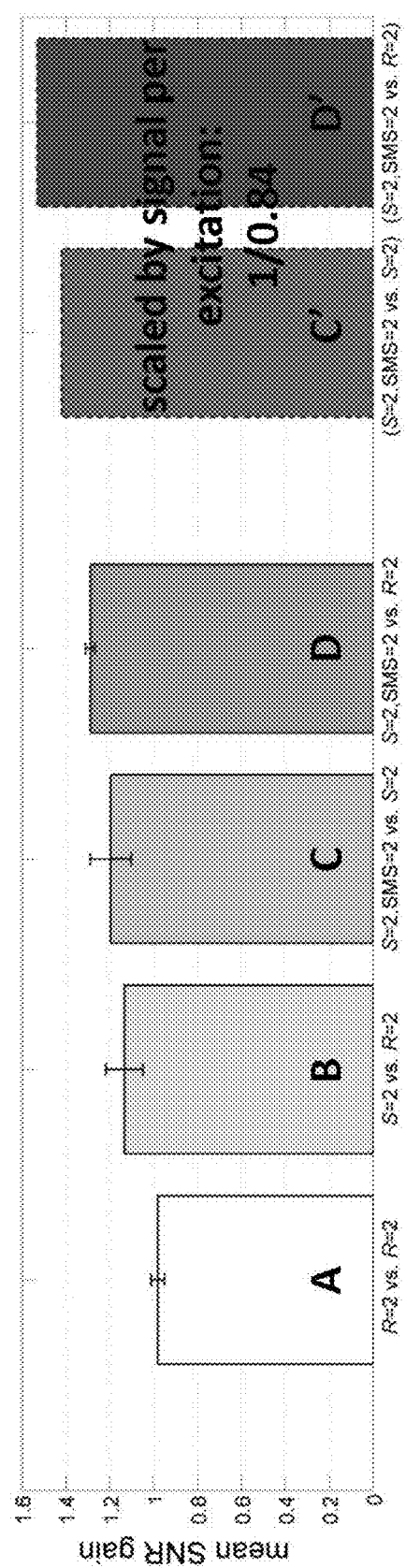
FIG. 8 is a graph illustrating SNR ratios from data comparisons across three human volunteer subjects.

Referring to FIG. 8, SNR ratios from the SMS2 data comparisons across three subjects are illustrated. Graph A illustrates that GRAPPA-reconstructed multi-shot data has comparable SNR to GRAPPA-reconstructed accelerated acquisition. Graph B shows that the multi-shot data exhibits a moderate SNR gain over the accelerated data, as expected. In the absence of physiological noise or system instability, the SNR in the conventional S=2 multi-shot acquisition would be √2 higher than the R=2 data, but the SNR is only about 15 percent higher. Graph C shows that the SMS2 multi-shot data exhibits about a 20 percent gain over the conventional multi-shot data, despite the lower available signal. This suggests that the shorter time interval reduced the physiological noise amplification. Graph D shows that the SMS2 two-shot data exhibits a nearly 30 percent increase compared to the R=2 accelerated data. Finally, graphs C' and D' provide the SNR values from graphs C and D scaled by the signal loss of a TR=2 s acquisition relative to a TR=4 s acquisition, as discussed relative to FIG. 7. This demonstrates the SNR gain due to the reduction in physiological noise amplification alone. Thus, the SMS2 multi-shot data exhibits an approximately 50 percent decrease in physiological noise amplification relative to the conventional, accelerated data.

Thus, the time-series SNR (SNRt) seen in the two-shot SMS image data is approximately 30 percent higher than the corresponding R=2 accelerated image data. The increased sensitivity is due to the increased in the amount of data relative to accelerated acquisitions and to the reduced physiological noise vulnerability relative to conventional multi-shot acquisitions. While the full 41 percent SNR increase is expected in the S=2, SMS2 data over the R=2 data, T1 effects, thermal noise enhancement, that is, g-factor effects, and remaining physiological noise differences occurring between the segments contribute additional SNR losses.

Notably, the present invention advantageously provides a system and method for shifting the FOV to control aliasing by phasing the different pulses. This is in contrast to other methods that rely on the shifting the FOV to control aliasing by gradient blips in the slice-encoding direction. By doing so, the present invention can realize, for example, a 20% reduction in EPI echo spacing and total image acquisition time, which can lead to a dramatic effect on image quality.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a series of images of a subject associated with a plurality of different slice locations using a magnetic resonance imaging (MRI) system, the steps of the method comprising:
   a) directing the MRI system to perform a pulse sequence that includes:
      generating a radio frequency (RF) excitation field that simultaneously excites spins in a plurality of different slice locations;
      establishing a first magnetic field gradient sequence along a first direction to form magnetic resonance signals from the excited spins;
      establishing a second magnetic field gradient sequence during the first magnetic field gradient sequence and along a second direction orthogonal to the first direction, wherein the first and second magnetic field gradient sequences define a k-space trajectory that traverses a segment of k-space;
      establishing a third magnetic field gradient sequence during the first magnetic field gradient sequence and along a third direction orthogonal to the first and second directions, wherein the third magnetic field gradient sequence imparts a phase shift to the formed magnetic resonance signals along one of the first and second directions;
   b) acquiring first k-space data from the segment of k-space, the first k-space data being indicative of the plurality of different slice locations;
   c) repeating a) and b) to acquire second k-space data from a different segment of k-space, wherein during the repetition of step a) at least one of the first and second magnetic field gradient sequences is modified to define a different k-space trajectory that traverses a different segment of k-space and wherein additional data is acquired from a given slice location by sampling a different segment of k-space; and
   d) reconstructing a series of images from the first and second k-space data, the series of images including images associated with the plurality of different slice locations.

2. The method as recited in claim 1, wherein the third magnetic field gradient sequence comprises a plurality of magnetic field gradient blips.

3. The method as recited in claim 2, wherein at least some of the plurality of magnetic field gradient blips have a different polarity than others of the plurality of magnetic field gradient blips.

4. The method as recited in claim 2, wherein at least some of the plurality of magnetic field gradient blips have a different magnitude than others of the plurality of magnetic field gradient blips.

5. The method as recited in claim 2, wherein at least some of the plurality of magnetic field gradient blips have a different magnitudes and polarities than others of the plurality of magnetic field gradient blips.

6. The method as recited in claim 1, wherein step c) includes modifying the third magnetic field gradient sequence during the repetition of step a) to impart a different phase shift to the formed magnetic resonance signals.

7. The method as recited in claim 1, wherein the first magnetic field gradient sequence comprises an alternating magnetic field gradient.

8. The method as recited in claim 1, wherein the second magnetic field gradient sequence comprises a plurality of magnetic field gradient blips.

9. The method as recited in claim 1, wherein the second magnetic field gradient sequence comprises a constant magnetic field gradient.

10. The method as recited in claim 1, wherein the second magnetic field gradient sequence comprises an alternating magnetic field gradient.

11. The method as recited in claim 1, wherein the k-space trajectory is a Cartesian trajectory.

12. The method as recited in claim 1, wherein the k-space trajectory is a spiral trajectory.

13. The method as recited in claim 1, wherein the RF excitation field is generated in step a) using a multiband RF pulse that includes a plurality of different sub-pulses, each of the plurality of different sub-pulses being associated with one of the plurality of different slice locations.

14. The method as recited in claim 13, wherein step c) includes modifying the multiband RF pulse used in the repetition of step a) to generate a different RF excitation field that excites the spins in the plurality of different slice locations while imparting an additional phase shift to the formed magnetic resonance signals.

15. The method as recited in claim 14, wherein modifying the multiband RF pulse comprises modifying a phase of at least one of the plurality of different sub-pulses.

16. The method as recited in claim 15, wherein modifying the phase of at least one of the plurality of different sub-pulses comprises adding a phase shift to the at least one of the plurality of different sub-pulses.

17. The method as recited in claim 16, wherein the phase shift added to the at least one of the plurality of different sub-pulses is a 180 degree phase shift.

18. The method as recited in claim 1, wherein step d) includes reconstructing the series of images using a reconstruction algorithm that accounts for the controlled aliasing imparted to the first and second k-space data.

19. The method as recited in claim 18, wherein the reconstruction algorithm includes a slice-GRAPPA reconstruction algorithm.

* * * * *